United States Patent [19]

Shiraishi et al.

[11] Patent Number: 5,307,317
[45] Date of Patent: Apr. 26, 1994

[54] SEMICONDUCTOR MEMORY DEVICE HAVING IMPROVED ACCESS TO ADDRESSES

[75] Inventors: Sumako Shiraishi, Kawasaki; Youichi Suzuki, Yokohama, both of Japan

[73] Assignee: Kabushiki Kaisha Toshiba, Kawasaki, Japan

[21] Appl. No.: 726,379

[22] Filed: Jul. 5, 1991

[30] Foreign Application Priority Data

Jul. 5, 1990 [JP] Japan .................. 2-177880

[51] Int. Cl.$^5$ .................. G11C 7/00; G11C 11/42
[52] U.S. Cl. .................. 365/205; 365/207; 365/189.01; 307/530
[58] Field of Search ........... 365/189.01, 189.05, 365/207, 205, 230.01; 307/530

[56] References Cited

U.S. PATENT DOCUMENTS

| | | | |
|---|---|---|---|
| 4,839,868 | 6/1989 | Sato et al. | 307/530 |
| 4,926,381 | 5/1990 | Fujii | 365/205 |
| 4,931,994 | 6/1990 | Matsui et al. | 365/189.01 |
| 5,138,578 | 8/1992 | Fujii | 365/205 |

Primary Examiner—Timothy P. Callahan
Attorney, Agent, or Firm—Foley & Lardner

[57] ABSTRACT

One cell of the first cell group CG and one cell of the second cell group CxG are selected simultaneously in response to address signals A1 and A2; data of these selected cells are amplified by the first and second sense amplifiers SA1 and SA2, respectively as sense outputs dA, $\overline{dA}$, dB, $\overline{dB}$; these sense outputs are given to a select circuit SEL including output buffer circuits OB; the select circuit outputs any of the first and second sense outputs to an output circuit Q17, Q18 in response to select signals $\overline{ODA}$, $\overline{ODB}$ applied from an output switch circuit OSW on the basis of a specific address signal A12, $\overline{A12}$. Since plural sense outputs based upon plural cell data are previously outputted simultaneously from the sense amplifiers to the select circuit and then one of the sense outputs is selected on the basis of a specific address, the cell data can be read at high speed as compared with when data are simply read from cells without simultaneous data transfer and data selection.

4 Claims, 4 Drawing Sheets

SEMICONDUCTOR MEMORY DEVICE HAVING IMPROVED ACCESS TO ADDRESSES

BACKGROUND OF THE INVENTION

The present invention relates to a semiconductor memory device, and more specifically to a semiconductor memory device suitable for a MOS static random access memory (SRAM) for realizing high speed access to cells.

FIG. 1 shows a prior-art semiconductor memory, in which only the data-read related portion is shown in detail. In the drawing, CG denotes a cell group. Cells C (C11, C21, C31, ... ; C12, C22, C32, ... ; ... ) of the cell group CG are connected to word lines WL (WL1, WL2, selected by a row address A1, respectively. Outputs of these cells C are read out through bit lines BL, $\overline{BL}$ (BL1, $\overline{BL1}$; BL2, $\overline{BL2}$; ... ). Data of the bit lines BL, $\overline{BL}$ are transmitted to two I/O lines IOL (IOL1, IOL2) via column switches CSW (CSW1, CSW2, ... ). Gates of these column switches CSW are connected to address lines AL (AL1, AL2, ... ) selected by a column address A2, respectively. Further, two I/O lines IOL1 and IOL2 are connected to a sense amplifier SA. Sense outputs d, $\overline{d}$ are outputted from the sense amplifier SA and then given to an output buffer circuit OB. Two output gate lines G0 and $\overline{G0}$ of the output buffer circuit OB are connected to gates of two series-connected output buffer transistors Q17 and Q18, respectively. An output signal $D_{out}$ can be obtained through a junction point between the two output buffer transistors Q17 and Q18.

The data reading operation of the prior-art memory device as described above will be described hereinbelow. When a word line WL1, for instance is selected by a row address A1, data are outputted from the cells C11, C21, ... to the bit lines BL1, $\overline{BL1}$; BL2, $\overline{BL2}$; .... On the other hand, if an address line AL1 (column switch CSW1), for instance is further selected by a column address A2, a data of the cell C11 is transmitted to the I/O line IO1, amplified by the sense amplifier SA, and then given to the output buffer circuit OB as two sense outputs d, $\overline{d}$, so that the outputs of the output buffer circuit OB are given to the gates of the two output buffer transistors Q17 and Q18 via the output gate lines G0, G1, respectively to generate a data of cell C11 as an output signal $D_{out}$.

Thereafter, when the row address changes and therefore another word line WL2, for instance is selected, data of the cells C12, C22 ... are transmitted to the bit lines BL1, $\overline{BL1}$; BL2, $\overline{BL2}$; ... Further, if the column address A2 changes and therefore another address line AL2 (column switch CSW2), for instance is selected, a data of the cell 22 is transmitted to the I/O line IOL. In the same way as already described, a data of cell 22 is obtained from the junction point between the two transistors Q17 and Q18 as an output signal $D_{out}$.

As described, in the prior-art semiconductor memory device, since the data read-out routes are all formed in the same way and therefore data are read from the respective cells via the same routes, respectively, the respective access times for reading data from the respective cells are roughly equal to each other. Therefore, it is extremely difficult to operate the memory unit (e.g. cash memory) in such a way that an access time on the basis of a specific address becomes shorter than that on the basis of the ordinary address.

SUMMARY OF THE INVENTION

Accordingly, the object of the, present invention is to provide a semiconductor memory device in which it is possible to realize a higher speed access to data on the basis of a specific address as compared with the access time on the basis of the ordinary address.

To achieve the above-mentioned object, the present invention provides a semiconductor memory device comprising: a plurality of cell groups including plural cells respectively, each cell of each group being selected on the basis of an address signal; a plurality of sense amplifiers for outputting data of the selected cell of each cell group as sense outputs; output switching means for deciding and outputting signals corresponding to any of the plural sense outputs as select signals on the basis of a specific address signal; selecting means for selecting and outputting signals corresponding to any of the plural sense outputs as select outputs in response to the select signals of the output switching means; and output means for outputting a data in response to the select outputs.

In the semiconductor memory device according to the present invention, the 1st to n-th cells of the 1st to n-th cell groups are selected by an address signal, respectively, and data of these selected cells are outputted as the 1st to n-th sense outputs via the 1st to n-th sense amplifiers. The outputted sense outputs are given to a selecting circuit. The selecting circuit outputs any of the 1st to n-th sense outputs as select outputs to the output circuit in response to select signals given from the output switch circuit on the basis of specific address signals. The output circuit outputs a data output corresponding to the applied select outputs. When the specific address signal changes under these conditions, the select circuit outputs signals corresponding to another sense output of the preceding sense outputs as the select output, so that the output circuit outputs data of the cells of different cell groups. In the latter access, since the cell data are already outputted from the sense amplifiers as the sense outputs, the cell data can be outputted only within the time required to switch the select circuit.

As described above, in the memory device according to the present invention, cells of a plurality of cell groups are selected on the basis of an address signal, respectively; a plurality of sense outputs outputted from a plurality of sense amplifiers on the basis of the data of these selected cells are led to an output circuit; any of the plural sense outputs is selected on the basis of a specific address; and data corresponding to the selected sense outputs can be outputted from the output circuit.

That is, since the output of the output switch circuit can be switched at high speed in response to a change in a specific address, a plurality of sense outputs based upon a plurality of cell data and previously outputted from the sense amplifiers to the select circuit can be simply switched before being outputted. Therefore, it is possible to output data at high speed when compared with when an access to a cell starts again after an output data from the output circuit has been outputted.

DESCRIPTION OF THE PREFERRED EMBODIMENTS

Embodiments of the present invention will be described hereinbelow with reference to the attached drawings.

Figure 1:
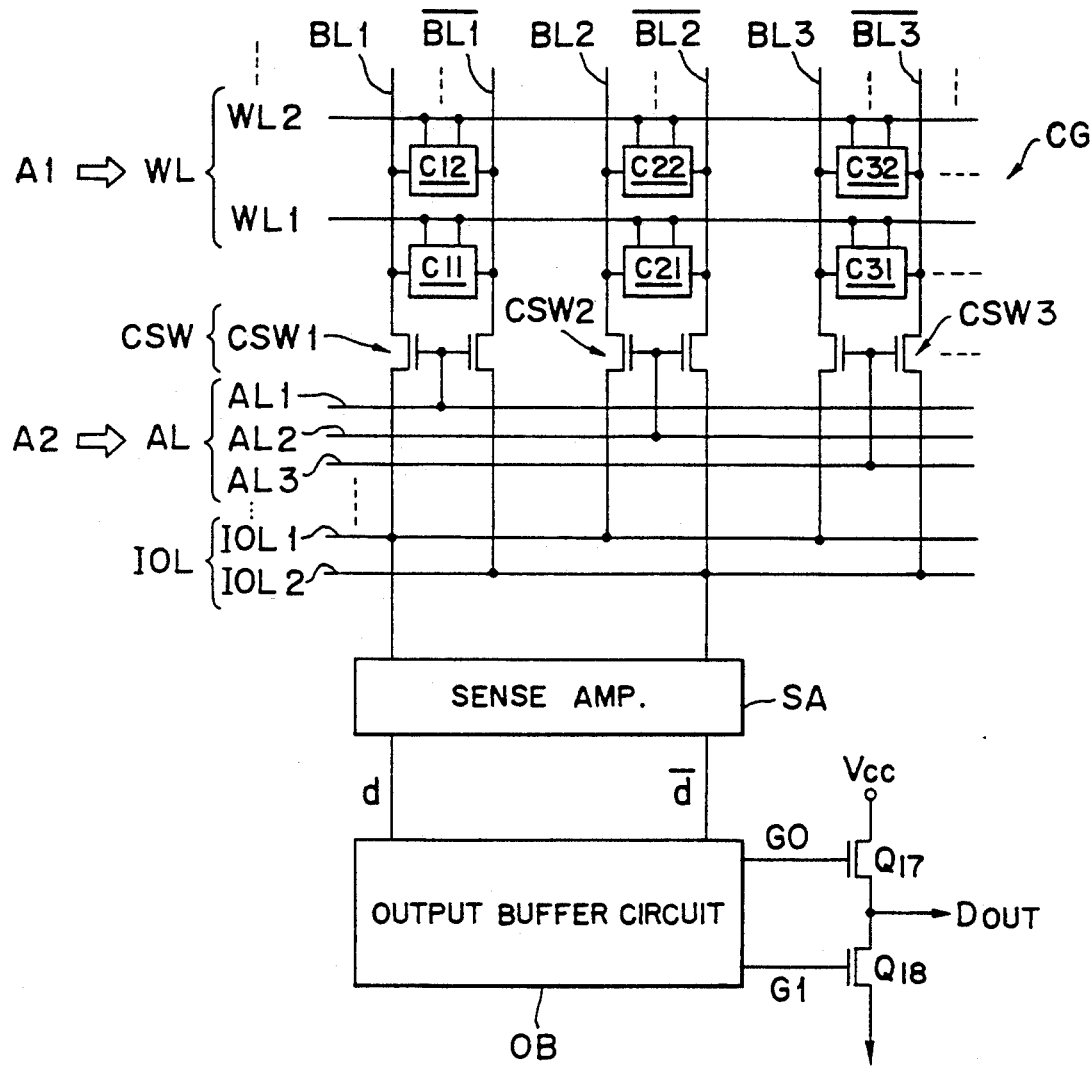
FIG. 1 is a schematic block diagram showing the essential portion of a prior-art semiconductor memory device.
Figure 2:
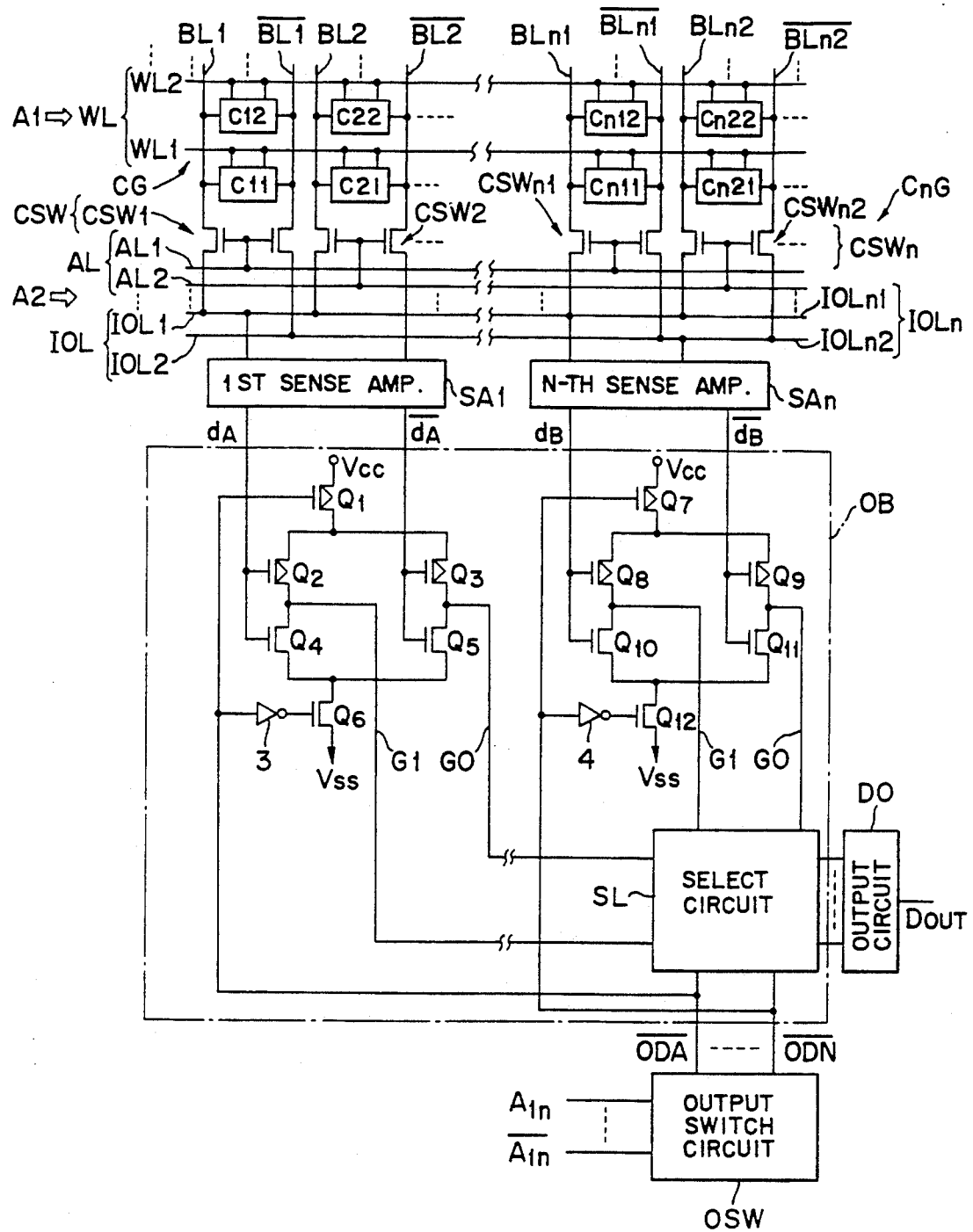
FIG. 2 is a schematic block diagram showing an embodiment of the present invention.

FIG. 2 shows an embodiment, in which only the circuit related to data reading operation is shown in detail. The same reference numerals and symbols have been retained for similar elements shown in FIG. 1. In FIG. 2, the semiconductor memory device according to the present invention is provided with first to n-th cell groups CG to CnG. Cells of the first cell group CG are composed of cells C11, C21, ... connected to a word line L1 and cells C12, C22, ... connected to a word line L2. The respective cells C are connected to bit lines BL, $\overline{BL}$(BL1, $\overline{BL1}$; BL2, $\overline{BL2}$; ... column switches CSW (CSW1, CSW2, ... ), address lines AL (AL1, AL2, .. . ), first I/O lines IOL (IOL1, IOL2), and the first sense amplifier SA1, in the same way as in FIG. 1.

Cells Cn of the n-th cell group are composed of cells Cn11, Cn21 connected to a word line WL1 and cells Cn12, Cn22 ... connected to the word line WL2. The respective cells Cn are connected to bit lines BLn, $\overline{BLn}$ (BLn1,$\overline{BLn1}$; BLn2, $\overline{BLn2}$; ... ), column switches CSWn (CSWn1, CSWn2, ... ), address lines AL (AL1, AL2, ... ), second I/O lines IOLn (IOLn1, IOLn2), and the n-th sense amplifier SAn, in the same way as with the case of the first cell group CG.

Sense outputs dA, $\overline{dA}$ are outputted from the first sense amplifier SA1. The sense output $\overline{dA}$ is inputted to gates of a P-channel transistor Q2 and an N-channel transistor Q4 of an output buffer circuit OB, respectively. The sense output dA is inputted to gates of a P-channel transistor Q3 and an N-channel transistor Q5 of the output buffer circuit OB, respectively. An output gate line G1 at the junction point between the two transistors Q2 and Q4 and an output gate line G0 at the junction point between the two transistors Q3 and Q5 are both connected to an output circuit D0 via a select circuit SEL.

On the other hand, sense outputs dB, $\overline{dB}$ are outputted from the n-th sense amplifier SAn. The sense output dB is inputted to gates of a P-channel transistor Q8 and an N-channel transistor Q10, respectively. The sense output $\overline{dB}$ is inputted to gates of a P-channel transistor Q9 and an N-channel transistor Q11. An output gate line G1 at the junction point between the two transistors Q8 and Q10 and an output gate line G0 at the junction point between the transistors Q9 and Q11 are both connected to the output circuit D0 via the select circuit SEL. Further, an output switch circuit OSW applies output select signals $\overline{ODA}$ to $\overline{ODN}$ to the select circuit SEL.

This output select signal $\overline{ODA}$ is applied directly to a gate of a P-channel transistor Q1 and via an inverter 3 to a gate of an N-channel transistor Q6. The transistors Q1 and Q6 are both connected in series to a parallel circuit of the series-connected transistors Q2 and Q4 and the series-connected transistors Q3 and Q5. On the other hand, the output select signal $\overline{ODN}$ is applied directly to a gate of a P-channel transistor Q7 and via an inverter 4 to a gate of an N-channel transistor Q12. The transistors Q7 and Q12 are both connected in series to a parallel circuit of the series-connected transistors Q8 and Q10 and the series-connected transistors Q9 and Q11. Since any one of these select signals $\overline{ODA}$... $\overline{ODN}$ is set to the "0" level, only data of the cell group corresponding thereto can be outputted as $D_{out}$. Further, the select signals $\overline{ODA}$... $\overline{ODN}$ from the output switch circuit OSW are switched in response to change in signal level of specific address signals A1n, $\overline{A1n}$ outputted from an external address buffer circuit (not shown).

Figure 3:
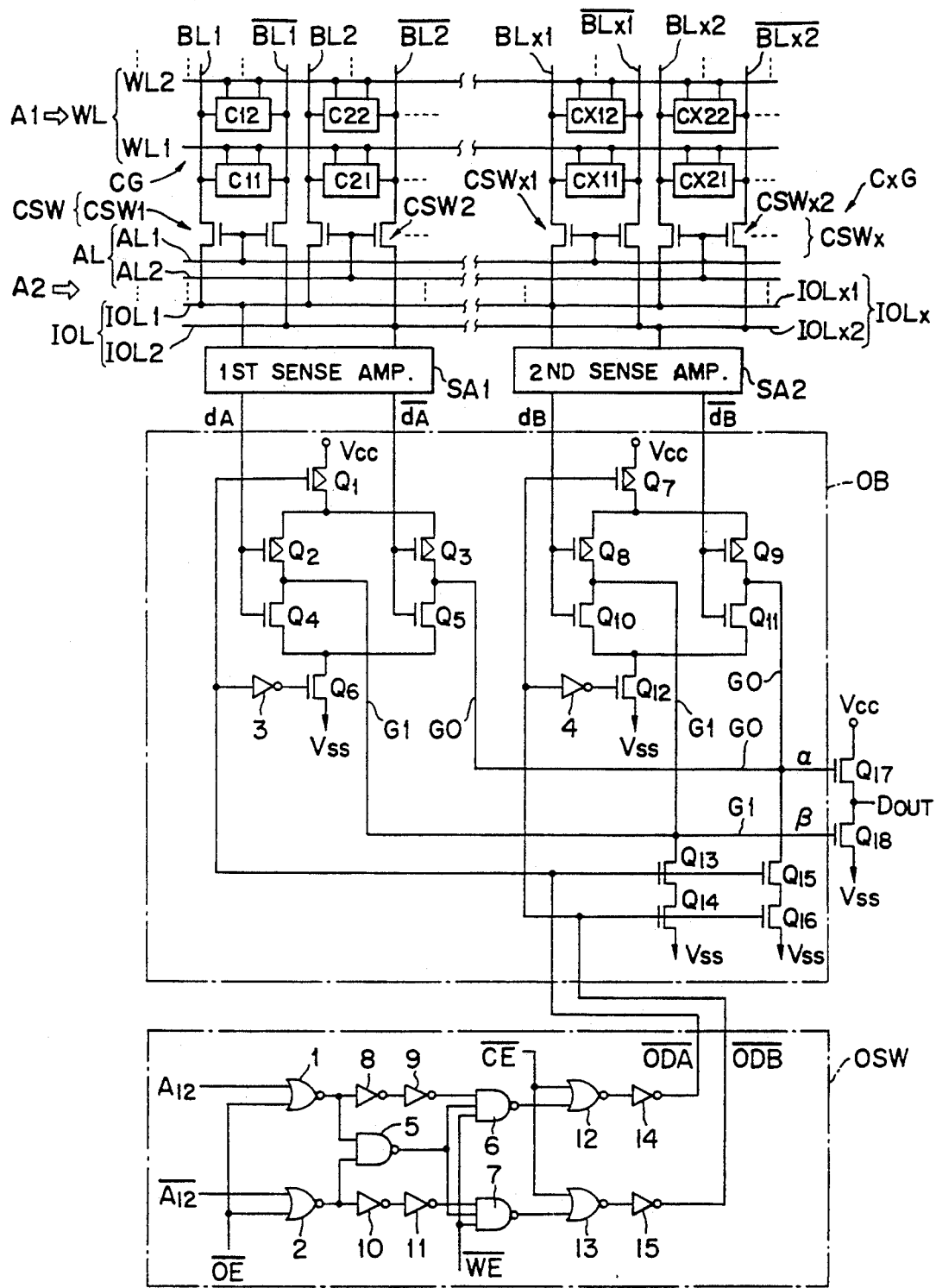
FIG. 3 is a schematic block diagram showing another embodiment of the present invention, in which n is set to 2.

FIG. 3 is a circuit diagram showing another embodiment where n=2 in the embodiment shown in FIG. 2.

The cells C of the first cell group CG are constructed and connected in the same way as in the embodiment shown in FIG. 2 and therefore the description thereof is omitted herein.

Cells of the second cell group CxG include cells Cx11, Cx21 connected to a word line WL1 and cells Cx12, Cx22 connected to a word line WL2. The respective cells Cx are connected to bit lines BLx, $\overline{BLx}$ (BLx1, $\overline{BLx1}$; BLx2, $\overline{BLx2}$; ... ), column switches CsWx (CsWx1, CsWx2 ... ), address lines AL (AL1, AL2, .. . ), second I/O lines IOLx (IOLx1, IOLx2) and the second sense amplifier SA2, in the same way as with the case of the cell group CG.

Sense outputs dA, $\overline{dA}$ are outputted from the first sense amplifier SA1. The sense output $\overline{dA}$ is inputted to gates of a P-channel transistor Q2 and an N-channel transistor Q4 of an output buffer circuit OB, respectively. The sense output dA is inputted to gates of a P-channel transistor Q3 and an N-channel transistor Q5 of the output buffer circuit OB. An output gate line G1 at the junction point between two transistors Q2 and Q4 is connected to a gate of an output buffer transistor Q18. An output gate line G0 at the junction point between two transistors Q3 and Q5 is connected to a gate of an output buffer transistor Q17.

On the other hand, sense outputs dB, $\overline{dB}$ are outputted from the second sense amplifier SA2. The sense output dB is inputted to gates of a P-channel transistor Q8 and an N-channel transistor Q10, respectively. The sense output $\overline{dB}$ is inputted to gates of a P-channel transistor Q9 and an N-channel transistor Q11, respectively. An output gate line G1 at the junction point between the two transistors Q8 and Q10 is connected to the gate of the output buffer transistor Q18. An output gate line G0 at the junction point between the two transistors Q9 and Q11 is connected to the gate of the output buffer transistor Q17.

Two series-connected N-channel transistors Q15 and Q16 are connected to the output gate line G0. Two series-connected N-channel transistors Q13 and Q14 are connected to the output gate line G1. Further, an output select signal $\overline{ODA}$ is applied from an output switch circuit OSW to the gates of the transistors Q13 and Q15, and an output select signal $\overline{ODB}$ is applied from the output switch circuit OSW to the gates of the transistors Q14 and Q16.

This output select signal $\overline{ODA}$ is applied directly to a gate of a P-channel transistor Q1 and via an inverter 3 to a gate of an N-channel transistor Q6. The transistors Q1 and Q6 are both connected in series to a parallel circuit of the series-connected transistors Q2 and Q4 and the series-connected transistors Q3 and Q5. On the other hand, the output select signal $\overline{ODB}$ is applied directly to a gate of a P-channel transistor Q7 and via an inverter 4 to an N-channel transistor Q12. The transistors Q7 and Q12 are both connected in series to a parallel circuit of the series-connected transistors Q8 and Q10 and the series-connected transistors Q9 and Q11.

Select signals $\overline{ODA}$, $\overline{ODB}$ of "0", "1" or "1", "0" are outputted from an output switch circuit OSW. In response to the select signals of "0", "1", data of the cells C in the first cell group CG are outputted as $D_{out}$. In response to the select signals of "1", "0", data of the cells Cx in the second cell group CxG are outputted as $D_{out}$. If the select signals $\overline{ODA}$, $\overline{ODB}$ are at "0", "0", data of the first and second cell groups CG and CxG are outputted simultaneously in superposed relationship with respect to each other. To prevent this erroneous operation, three NAND gates 5, 6 and 7 are incorporated in the output switch circuit OSW, as described later in further detail. The select signals $\overline{ODA}$, $\overline{ODB}$ from the output switch circuit OSW are switched on the basis of change in signal level of address signals A12, $\overline{A12}$. These address signals A12, $\overline{A12}$ are of a specific address given from outside and therefore given by an address buffer circuit (not shown). The address signal A12 is inputted to a NOR gate 1 together with an output enable signal $\overline{OE}$. The output of the NOR gate 1 is given to an inverter 8 and a NAND gate 5. On the other hand, an address signal $\overline{A12}$ is inputted to a NOR gate 2 together with the output enable signal $\overline{OE}$. The output of the NOR gate 2 is given to the inverter 10 and the NAND gate 5. The output of the inverter 8 is further inverted by an inverter 9 and then inputted to a NAND gate 6 together with the output of the NAND gate 5 and a write enable signal $\overline{WE}$. On the other hand, the output of the inverter 10 is further inverted by an inverter 11 and then inputted to a NAND gate 7 together with the output of the NAND gate 5 and the write enable signal $\overline{WE}$. The output of the NAND gate 6 is inputted to a NOR gate 12 together with a chip enable signal $\overline{CE}$. The output of the NOR gate 12 is outputted via an inverter 14 as an output select signal $\overline{ODA}$. On the other hand, the output of the NAND gate 7 is inputted to a NOR gate 13 together with the chip enable signal $\overline{CE}$. The output of the NOR gate 13 is outputted via an inverter 15 as an output select signal $\overline{ODB}$.

The data reading operation of the above-mentioned memory device will be briefly described hereinbelow.

One cell C of the first cell group CG and one cell of the second cell group CxG are selected in response to address signals A1 and A2. Data in these selected cells C and Cx are amplified by the first and second sense amplifiers SA1 and SA2, respectively as sense outputs dA, $\overline{dA}$ and dB, $\overline{dB}$. These sense outputs are applied to the output buffer transistors Q17 and Q18 on the basis of the output select signals $\overline{ODA}$, $\overline{ODB}$ applied from the output switch circuit OSW. For instance, under the condition that the sense outputs dA, $\overline{dA}$ are being applied from the first sense amplifier SA1 to the transistors Q17 and Q18 to obtain an output $D_{out1}$, if the output select signals $\overline{ODA}$, $\overline{ODB}$ change in signal level, sense outputs dB, $\overline{dB}$ are given to the transistors Q17 and Q18, so that a new output $D_{out2}$ can be obtained. Since the sense outputs dB, $\overline{dB}$ are previously applied to, the output buffer circuit OB, the new output $D_{out2}$ can be read at high speed when compared with when a new data is read from the cells.

The data reading operation thereof will be described in more detailed hereinbelow.

Assumption is made that the memory device is now in data-read status; that is, the output enable signal $\overline{OE}$ is at "0" to select the output status; the write enable signal $\overline{WE}$ is at "1" not to select the write status; and the chip enable signal $\overline{CE}$ is at "0" to select this chip memory.

Further, if the word line WL1 is selected, for instance in response to the row address A1 and the address line AL1 is selected, for instance in response to the column address A2, data of the cells C11 and Cx11 are outputted to the I/O lines IOL and IOLx, respectively. These data are amplified by the first and second sense amplifiers SA1 and SA2, respectively, and outputted to the output buffer circuit OB as sense outputs dA, $\overline{dA}$; dB, $\overline{dB}$. That is, the sense output dA is applied to the gates of the transistors Q2 and Q4, respectively; the sense output $\overline{dA}$ is applied to the gates of the transistors Q3 and Q5, respectively; the sense output $\overline{dB}$ is applied to the gates of the transistors Q8 and Q10, respectively; and the sense output dB is applied to the gates of the transistors Q9 and Q11, respectively.

Figure 4:
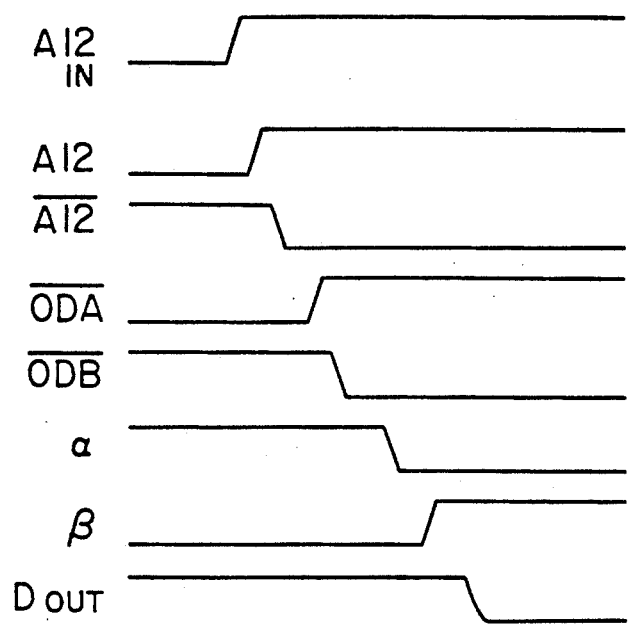
FIG. 4 is a timing chart for assistance in explaining the operation of the memory device.

With reference to FIG. 4, the operation of when the address changes will be described hereinbelow. Now, assumption is made that address A12="0" and $\overline{A12}$="1". Under these conditions, $\overline{ODA}$="0" and $\overline{ODB}$="1", so that transistors Q1 and Q6 are turned on and transistors Q7 and Q12 are turned off. Further, if sense outputs dA="1"; $\overline{dA}$="0"; dB="0"; and $\overline{dB}$="1", the transistors Q2 and Q5 are turned off and the transistors Q3 and Q4 are turned on. Therefore, an electric charge at the node β (the output gate line G1) is discharged to "0" through the transistors Q4 and Q6. In contrast, the node α (the output gate line G0) is charged to "1" through the transistors Q1 and Q3. On the other hand, since the transistors Q7 and Q12 are both kept turned off, no charge/discharge circuit is formed on the second sense amplifier (SA2) side. That is, the sense outputs dB, dB are not transmitted to the nodes α and β, so that nodes α="1"; β="0", and thereby the transistors Q17 and Q18 are turned off to output an output signal of $D_{out}$="1".

Under these conditions, if only the address changes as A12="1", $\overline{A12}$="0" without changing the address signals A1 and A2, the output select signals are $\overline{ODA}$="1" and $\overline{ODB}$="0". Therefore, the transistors Q1 and Q6 are turned off, so that the sense outputs dA, $\overline{dA}$ are not transmitted to the nodes α and β. On the other hand, since the transistors Q7 and Q12 are turned on and further dB="0" and $\overline{dB}$="1", the transistors Q8 and Q11 are turned on and the transistors Q10 and Q9 are turned off. Therefore, an electric charge at the node α is discharged through the transistors Q11 and Q12 and the node β is charged through the transistors Q7 and Q8, so that the node α is at "0" and the node β is at "1" and thereby an output $D_{out}$="0" can be obtained.

As described above, it is possible to change data outputted from the cell C (e.g. cell C11) to data outputted from the cell Cx (e.g. cell Cx11) by changing the address A12, $\overline{A12}$. When data is being outputted from the cell C11, data (the sense outputs dB, $\overline{dB}$) from the cell Cx11 are being applied to the output buffer circuit OB. Therefore, the time required to output a data from the cell Cx11 can be shorted by the time required to read a data from a new cell through the bit line, the I/O line and the sense amplifier, thus increasing data read-out speed.

Further, when the output enable signal $\overline{OE}$="1", since the output select signals $\overline{ODA}$ and $\overline{ODB}$ are both at "1", the transistors Q13, Q14; Q15, Q16 are all turned on and the transistors Q1, Q6; Q7, Q12 are all turned off, so that the sense outputs dA, $\overline{dA}$; dB, $\overline{dB}$ are not transmitted to the nodes α and β. In addition, since the transistors Q12, Q14; Q15, Q16 are turned on, the nodes α and β are both discharged to "0", so that the output buffer transistors Q17, Q18 are both turned off to keep the output $D_{out}$ in a high impedance state.

Further, as already described, since the logical circuit including three NAND gates 5, 6 and 7 as shown in FIG. 3 is adopted as the output switch circuit OSW, it is possible to securely prevent the output select signals $\overline{ODA}$ and $\overline{ODB}$ from being set to "0" (the select status) simultaneously when the address A12 and $\overline{A12}$ changes.

What is claimed is:

1. A semiconductor memory device comprising:
a plurality of cell groups each including a plurality of columns to which a plurality of cells are connected respectively, said cells of each of said cell groups being selected on the basis of an address designation;
column selection means for selecting corresponding columns of said plurality of cell groups;
a plurality of sense amplifiers provided for said plurality of cell groups for respectively outputting data of selected cells from said cell groups as sense outputs;
selection means for determining data corresponding to any one of the sense outputs to be outputted and for outputting selection signals on the basis of specific address signals; and
output means for selectively outputting one of said sense outputs in response to the selection signals of said selection means.

2. The semiconductor memory device as claimed in claim 1, wherein said selection means includes means for preventing said selection signals from being simultaneously selected and output buffer means for permitting the sense outputs selected to be transferred only when one of the selection signals of said selection means is selected.

3. A semiconductor memory device comprising:
a first cell group including a plurality of first cells, any one of the first cells being selected on the basis of an address designation;
a second cell group including a plurality of second cells, any one of the second cells being selected on the basis of said address designation;
a first sense amplifier for outputting data of the first cell selected as the second sense output;
a column selection circuit for selecting corresponding columns of said first and second cell groups;
a selection circuit for determining either the first sense output or the second sense output is to be outputted and for outputting selection signals on the basis of a specific address signal;
an output circuit for selectively outputting one of the first and second sensed outputs in response to the selection signals of said selection circuit.

4. The semiconductor memory device as claimed in claim 3, wherein said selection circuit includes means for preventing said selection signals from being simultaneously selected and output buffer means for permitting the sense outputs selected to be transferred only when one of the selection signals of said selection circuit is selected.

* * * * *